United States Patent [19]

Einthoven et al.

[11] 3,997,910
[45] Dec. 14, 1976

[54] SEMICONDUCTOR DEVICE WITH SOLDER CONDUCTIVE PATHS

[75] Inventors: Willem Gerard Einthoven, Belle Mead; William Hulstrunk, Millburn, both of N.J.

[73] Assignee: RCA Corporation, New York, N.Y.

[22] Filed: Feb. 26, 1975

[21] Appl. No.: 553,089

[52] U.S. Cl. .................................. 357/68; 357/65; 357/86

[51] Int. Cl.² .................................. H01L 23/48

[58] Field of Search .................. 357/65, 68, 86

[56] References Cited
UNITED STATES PATENTS 3,590,339   6/1971   Bilo et al. .................. 357/86

Primary Examiner—Edward J. Wojciechowicz
Attorney, Agent, or Firm—H. Christoffersen; R. P. Williams; R. A. Hays

[57] ABSTRACT

In devices including a body of semiconductor material having layers of solder on a surface thereof serving as current connectors, flow of solder from the layers to terminal leads soldered to the layers during the terminal lead soldering process is prevented by the presence of a gap between the terminal leads and the solder layers. Electrical connection between the solder layers and the terminal leads is provided by conductive regions within the body to which the terminal leads and the solder layers are contacted.

11 Claims, 3 Drawing Figures

SEMICONDUCTOR DEVICE WITH SOLDER CONDUCTIVE PATHS

This invention relates to semiconductor devices, and particularly to devices of the type having conductive paths of metal on a surface of the semiconductor body thereof to which a terminal lead is soldered.

Various semiconductor devices, such as power transistors including interdigitated emitter and base regions within a body of semiconductor material, include a pattern of metal on the body surface which is generally coextensive with the base and emitter regions, the metal pattern providing low resistance paths for current from each of these regions to portions of the device where terminal leads are connected. In one type of such device, the metal paths include a layer of solder, and the terminal leads are secured to the metal paths by soldered joints.

The thickness of the solder on the metal paths is selected to provide the paths with a high electrical conductivity. In the fabrication of the devices, however, a problem sometimes encountered is that the desired solder thickness is not attained. This reduced solder thickness, and the correspondingly reduced path conductivity, adversely affects the performance characteristics of the devices. Thus, a need exists for a means to insure that the desired thickness of solder on the metal paths is consistently attained from device to device.

In the fabrication of devices of the type in which the above-described problem exists, a layer of solder of the desired thickness is generally first provided on metal paths on the semiconductor material body surface, and the entire workpiece is then heated to solder the terminal leads to the solder layers. During this heating, the solder layers melt, and, to a greater or lesser degree, tend to flow towards and into contact with the terminal leads. To the extent that such flow occurs, the solder actually leaving the metal paths and accummulating on the leads, the thickness of the solder layers is reduced and the resistance thereof accordingly increased.

My solution to this problem is to provide a gap or barrier between the solder layers and the terminal leads connected thereto, the physically separated solder layers and terminal leads being electrically connected only by means of portions or regions of the semiconductor body to which both the terminal leads and associated solder layers are connected.

Figure 1:
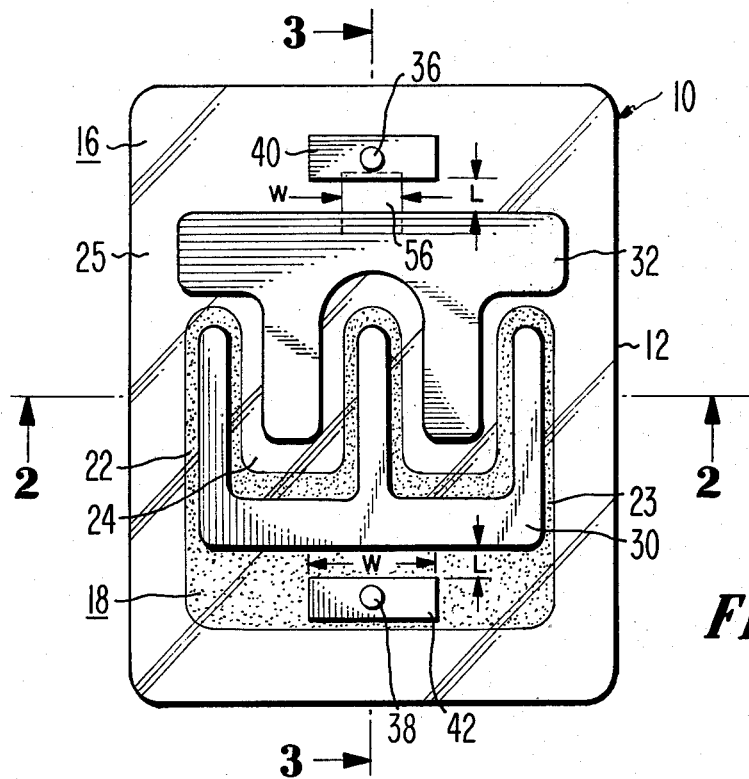
FIG. 1 is a plan view of a semiconductor device made in accordance with this invention.
Figure 2:
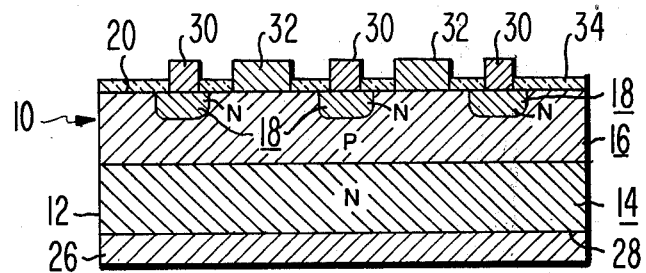
FIG. 2 is a section taken along line 2—2 of FIG. 1.

With reference to FIGS. 1 and 2, a semiconductor device 10 is shown comprising a body 12 of semiconductor material, e.g., silicon, including a collector region 14 of, in this embodiment, N type conductivity, a base region 16 of P type conductivity, and an emitter region 18 of N type conductivity, the emitter region 18 being stippled in FIG. 1 for greater clarity. As shown in FIG. 2, both the emitter region 18 and the base region 16 extend to a surface 20 of a semiconductor body, and, as shown in FIG. 1, the emitter region 18 and the base region 16 include "finger" portions 22 and 24, respectively, which are interdigitated. The finger portions 22 of the emitter region 18 are joined at a common portion 23, and the finger portions 24 of the base region are joined at a common portion 25.

Various metal layers are provided on surfaces of the semiconductor body 12 to serve as electrodes of the device. Thus, a metal layer 26 on the bottom surface 28 (FIGS. 2 and 3) is directly connected with the collector region 14 and comprises the collector electrode. An emitter electrode comprises a metal layer 30 (FIGS. 1 and 2) overlying and in direct contact with the interdigitated portion 22 and the common portion 23 of the emitter region 18, and a base electrode comprises a metal layer 32 overlying and in direct contact with the interdigitated portion 24 and the common portion 25 of the base region 16.

Where the surface 20 of the body 12 is not directly contacted by a metal layer, it is coated with a layer 34 of a protective material, e.g., silicon dioxide.

To the point so far described, the device 10 is of known type.

For the purpose of attaching a base terminal lead 36 (FIG. 3) and an emitter terminal lead 38 to the silicon body 12, two additional metal layers 40 and 42 are provided overlying and in direct contact with portions 44 and 46, respectively, of the base region 16 and the emitter region 18. The terminal 36 is attached to the layer 40 and the terminal 38 is attached to the layer 42 by means of solder joints.

All of the metal layers comprise a solder, e.g., 5% tin- 95% lead, by weight. The choice of solder is not critical.

To prevent the flow of solder between the layers 32 and 40 and between the layers 30 and 42 during the soldering of the terminal leads 36 and 38 to the layers 40 and 42, respectively, a gap or separation 50 (FIG. 3) is provided at the body surface 20 between the layers 32 and 40, and a similar gap 52 is provided between the layers 30 and 42. While not essential, the physical separation between each pair of layers 32 and 40 and 30 and 42 is reinforced by the presence in the gaps of a portion of the layer 34 of protective material.

Figure 3:
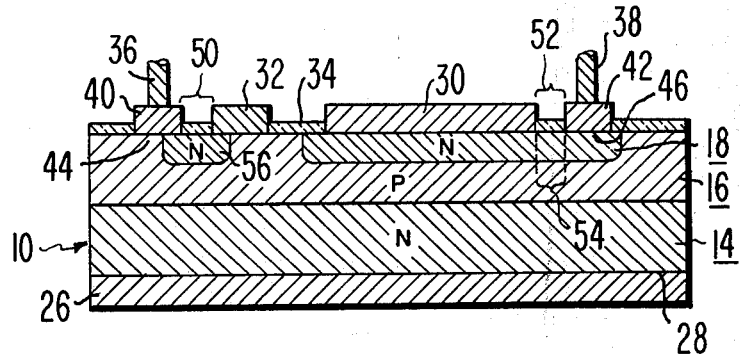
FIG. 3 is a section taken along line 3—3 of FIG. 1.

As shown in FIG. 3, each layer 30 and 42 is in direct contact with the emitter region 18, hence the two layers 30 and 42 are electrically connected together through only a region or portion 54 of the emitter region directly beneath the gap 52 between these layers. In this embodiment, the portion 54 is integral with and identically doped as the other portions of the emitter region 18, the portion or "region" 54 being distinguished from the remainder of the region 18 by the function thereof.

While not essential, it is sometimes preferred to minimize the resistance introduced by the semiconductor portion 54 in series between the two layers 30 and 42 by doping the portion 54 to a conductivity higher than that of the other portions of the emitter region 18. In such embodiment, the portion or region 54 differs structurally, i.e., in the doping thereof, from the emitter region 18.

The two layers 32 and 40 are each in direct contact with the base region 16, hence are electrically connected together only by a portion 56 of semiconductor material within the base region 16 underlying the gap 50 between these layers. In this embodiment, as shown, the portion 56 connecting the two layers 32 and 40 is of N type conductivity, i.e., of conductivity type opposite to that of the P type base region 16.

The reason for the use of an N type conductivity portion 56 is that the base regions of transistors are typically of lower conductivity material than that of the emitter regions thereof, e.g., in the order of 10 to 10,000 times lower. This is generally known. To minimize the resistance of the portion 56 connecting together the two layers 32 and 40, one approach is to dope the portion 56 to a higher level of P type conductivity than the remainder of the P type base region 16. This, however, requires the performance of two P type impurity providing steps in the fabrication of the device; one for the P base region 16, the other for the more highly doped connecting portion 56.

Since, however, the conductivity of the emitter region 18 is higher than that of the base region 10, as above-noted, an alternate and preferred approach, used in the instant embodiment, is to make the connecting portion 56 of N type conductivity simultaneously with the formation of the N type emitter region 18. Thus, an extra impurity providing step is not required. Alternately, and especially if the connector portion 54 within the emitter region 18 is doped to a higher conductivity than the remainder of the region 18, the connector portion 56 can be similarly doped to such higher conductivity. Various doping combinations can be used as desired.

The fabrication of the device 10 can be by known and conventional means. Thus, as above-indicated, the various emitter and base regions, and the layer connecting portions 54 and 56 can be provided by known impurity providing techniques, e.g., known diffusion processes. Then, the continuous layer 34 of silicon dioxide is provided covering the surface 20 of the body, and the layer 34 is partially removed to expose those portions of the surface 20 which are to be contacted by the various metal layers.

The body 12 is then immersed in a known electroless plating solution to plate nickel onto only the exposed portions of the surface 20 as well on the bottom surface 18, the plated body then being heated to sinter the nickel in place. Electroless plating techniques are known. The nickel layer has a thickness of about 200 A. The partially nickel plated body is then immersed in a bath of molten solder to provide the various solder layers thereon, the solder adhering only to the nickel plated portions of the body 12, the various solder layers being from about 5 to 50 micrometers thick. The two terminal leads 36 and 38 (of, for example, nickel plated copper) are then soldered to the solder layers 40 and 42, respectively, the physical separation or gap 50 between the layers 32 and 40, and the gap 52 between the layers 30 and 42 preventing flow of solder between the respective pairs of layers during the lead terminal soldering procedure.

The connector portions 54 and 56 are designed so that, in operation of the device 10, the maximum voltage drop between either terminal lead 36 or 38 and the most distant parts of the collector layers 32 and 30, respectively, connected thereto is not in excess of 100 millivolts, and preferably about or less than 50 millivolts. In comparison with known devices in which current paths through series resistors are provided for the purpose of affecting the electrical characteristics of the device (see, for example, U.S. Pat. No. 3,742,319, issued June 26, 1973), the resistance of the connector portions 54 and 56, selected, as above noted, to minimize the voltage drop thereacross, is quite small and ineffective to accomplish the results of the prior art devices in which such resistive elements are deliberately included.

In one embodiment of the instant invention, for example, the base region 16 comprises an epitaxially deposited layer having a uniform resistivity of 10 ohm-cm and a thickness (between the collector region 14 and the surface 20 of the body 12) of about 20 micrometers. The emitter region 18 is formed by diffusion of phosphorous at a surface concentration of about $10^{20}/cm^3$ to a depth of about 10 micrometers, and has a sheet resistance of about 0.5 ohm per square. In operation of the device 10, the maximum emitter current is 4 amps, and the maximum base current is 400 milliamps. To attain the desired low voltage drops in the portions of 54 and 56 of the device 10, the region 56 is designed to have a resistance of about 125 milliohms, e.g., it has a length L (FIG. 1) between the facing edges of the two layers 32 and 40 of about 50 micrometers and a width W of 200 micrometers. The sheet resistance of the region 56 is that of the N emitter 18, i.e., 0.5 ohm per square. Similarly, the region 54 is dimensioned to have a resistance of about 12.5 milliohms, e.g., it has a length L of 50 micrometers and a width of 2000 micrometers.

To minimize flow of solder during the terminal lead soldering step, the gaps 50 and 52 are preferably positioned quite close to the points of attachment of the terminal leads to the body 12. Thus, as shown in FIG. 1, the various emitter and base region finger portions 22 and 24 are each connected to "common" or "trunk" portions 23 and 25, respectively. By locating the gaps 50 and 52 between the common portions 23 and 25 and the terminal leads 38 and 36, respectively, rather than between the various finger portions and their associated common or trunk portions, flow of solder from the common portions onto the terminal leads is avoided. Stated differently, the lengths of the solder layers 40 and 42 in the directions of current flow therethrough are quite small in comparison with the lengths of the solder layers 30 and 32, whereby, to the extent that solder does flow off the layers 40 and 42 during the terminal leads soldering step, the effect of this loss of solder on the total resistance of the surface connections between the emitter and base regions and their respective terminal leads is relatively small.

What is claimed is:

1. A semiconductor device comprising:
   a body of semiconductor material, and first and second doped regions within said body,
   first and second layers of solder on a surface of said body in spaced apart relation, said first layer being in contact with said first and second regions, and said second layer being in contact with said second region, said layers being electrically connected through only said first and said second regions, and
   a terminal lead soldered to said second layer, the length of said second layer being small in comparison with the length of said first layer when measured in the directions of current between said terminal lead and said first region, whereby upon the soldering of said terminal lead to said second layer, the increase of resistance to current flow to said first region caused by flow of solder from said second layer onto said terminal lead is small.

2. A semiconductor device as in claim 1 in which said first and second regions have the same conductivity characteristics.

3. A semiconductor device as in claim 1, wherein the resistance of said second region is such that the voltage drop therealong, during operation of said device at its maximum rated current for said first region, is less than 100 millivolts.

4. A semiconductor device as in claim 1 in which said second region has a higher conductivity than that of said first region.

5. A semiconductor device as in claim 4 in which said first and second regions are of mutually opposite conductivity type.

6. A semiconductor device as in claim 5 including an emitter region of one type conductivity, said first region comprising a base region of said device of opposite type conductivity.

7. A semiconductor device comprising:
- a body of semiconductor material, and first and second doped regions within said body of mutually opposite conductivity type,
- a layer of solder on a surface of said body in contact with both said first and second regions, and
- a terminal lead soldered to said body in spaced relation with said layer and in contact with said second region, said second region having a conductivity higher than that of said first region and serving as an electrical connector between said lead and said layer, said layer and said terminal lead being electrically connected through only said first and said second regions.

8. A semiconductor device as in claim 6 including an emitter region, said first region comprising a base region of said device, said emitter and said second region having the same conductivity characteristics.

9. A semiconductor device comprising:
- a body of semiconductor material, and first and second doped regions within said body,
- a layer of solder on a surface of said body in contact with said first region, and
- a terminal lead soldered to said body in spaced relation with said layer, said lead and said layer being connected to said second region, the voltage drop along said second region, during operation of said device at its maximum rated current for said first region, being less than 100 millivolts, said layer and said terminal lead being electrically connected through only said first and said second regions.

10. A semiconductor device as in claim 9 in which said first and second regions have the same conductivity characteristics.

11. A semiconductor device as in claim 10 in which said second region has a higher conductivity than that of said first region.

* * * * *